United States Patent
Lau et al.

(10) Patent No.: US 12,261,062 B2
(45) Date of Patent: Mar. 25, 2025

(54) SPOT HEATING BY MOVING A BEAM WITH HORIZONTAL ROTARY MOTION

(71) Applicant: Applied Materials, Inc., Santa Clara, CA (US)

(72) Inventors: Shu-Kwan Danny Lau, Sunnyvale, CA (US); Toshiyuki Nakagawa, Narita (JP); Zhiyuan Ye, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 18/223,923

(22) Filed: Jul. 19, 2023

(65) Prior Publication Data

US 2023/0369077 A1 Nov. 16, 2023

Related U.S. Application Data

(63) Continuation of application No. 16/923,949, filed on Jul. 8, 2020, now Pat. No. 11,842,907.

(51) Int. Cl.
*H01L 21/67* (2006.01)
*B23K 26/00* (2014.01)
(Continued)

(52) U.S. Cl.
CPC .... *H01L 21/67115* (2013.01); *B23K 26/0006* (2013.01); *B23K 26/0648* (2013.01);
(Continued)

(58) Field of Classification Search
CPC ............. H01L 21/67115; H01L 21/268; H01L 21/68764; B23K 26/0006; B23K 26/0648;
(Continued)

(56) References Cited

U.S. PATENT DOCUMENTS

| 5,332,442 A | 7/1994 | Kubodera et al. |
| 6,092,299 A | 7/2000 | Yamazaki et al. |

(Continued)

FOREIGN PATENT DOCUMENTS

| CN | 101189361 A | 5/2008 |
| CN | 105200387 A | 12/2015 |

(Continued)

OTHER PUBLICATIONS

International Search Report and Written Opinion dated Sep. 1, 2021 for Application No. PCT/US2021/031486.

(Continued)

*Primary Examiner* — Monica D Harrison
*Assistant Examiner* — Andre C Stevenson
(74) *Attorney, Agent, or Firm* — Patterson + Sheridan, LLP

(57) ABSTRACT

Embodiments of the present disclosure generally relate to apparatus and methods for semiconductor processing, more particularly, to a thermal process chamber. In one or more embodiments, a process chamber comprises a first window, a second window, a substrate support disposed between the first window and the second window, and a motorized rotatable radiant spot heating source disposed over the first window and configured to provide radiant energy through the first window.

16 Claims, 7 Drawing Sheets

(51) Int. Cl.
  *B23K 26/06* (2014.01)
  *B23K 26/08* (2014.01)
  *B23K 103/00* (2006.01)
  *F27B 17/00* (2006.01)
  *F27D 5/00* (2006.01)
  *F27D 9/00* (2006.01)
  *H01L 21/268* (2006.01)
  *H01L 21/687* (2006.01)

(52) U.S. Cl.
  CPC ...... *B23K 26/0869* (2013.01); *F27B 17/0025* (2013.01); *F27D 5/0037* (2013.01); *H01L 21/268* (2013.01); *H01L 21/68764* (2013.01); *B23K 2103/56* (2018.08); *F27D 2009/007* (2013.01)

(58) Field of Classification Search
  CPC ............ B23K 26/0869; B23K 2103/56; F27B 17/0025; F27D 5/0037; F27D 2009/007
  See application file for complete search history.

(56) References Cited

U.S. PATENT DOCUMENTS

| | | | |
|---|---|---|---|
| 7,358,186 | B2 | 4/2008 | Dordi et al. |
| 7,875,554 | B2 | 1/2011 | Dordi et al. |
| 8,420,169 | B2 | 4/2013 | Negishi |
| 8,490,573 | B2 | 7/2013 | Dordi et al. |
| 10,029,332 | B2 | 7/2018 | Kim et al. |
| 10,576,582 | B2 | 3/2020 | Kim et al. |
| 11,021,795 | B2 | 6/2021 | Lau et al. |
| 11,171,023 | B2 | 11/2021 | Chu et al. |
| 11,177,144 | B2 | 11/2021 | Lau et al. |
| 11,713,505 | B2 | 8/2023 | Lauffer |
| 11,821,088 | B2 | 11/2023 | Lau et al. |
| 2001/0027969 | A1 | 10/2001 | Takahashi et al. |
| 2005/0130415 | A1 | 6/2005 | Dordi et al. |
| 2008/0153291 | A1 | 6/2008 | Dordi et al. |
| 2010/0110556 | A1 | 5/2010 | Chann et al. |
| 2010/0170439 | A1 | 7/2010 | Negishi |
| 2010/0170444 | A1 | 7/2010 | Negishi |
| 2010/0178424 | A1 | 7/2010 | Negishi |
| 2010/0209609 | A1 | 8/2010 | Negishi et al. |
| 2011/0081779 | A1 | 4/2011 | Dordi et al. |
| 2012/0145697 | A1 | 6/2012 | Komatsu et al. |
| 2013/0248504 | A1* | 9/2013 | Kusuda ............ H01L 21/67115 219/121.85 |
| 2014/0000515 | A1 | 1/2014 | Hendrickson et al. |
| 2016/0071745 | A1 | 3/2016 | Kim et al. |
| 2017/0103907 | A1 | 4/2017 | Chu et al. |
| 2018/0311764 | A1 | 11/2018 | Kim et al. |
| 2019/0127851 | A1* | 5/2019 | Lau .................... H01L 21/68785 |
| 2019/0371631 | A1* | 12/2019 | Lau ........................ B23K 26/034 |
| 2021/0189593 | A1* | 6/2021 | Burrows ............. C23C 16/4411 |
| 2021/0285105 | A1 | 9/2021 | Lau et al. |
| 2021/0310120 | A1 | 10/2021 | Lauffer |
| 2024/0044004 | A1 | 2/2024 | Lau et al. |

FOREIGN PATENT DOCUMENTS

| | | |
|---|---|---|
| CN | 111263977 A | 6/2020 |
| DE | 102018121854 A1 | 3/2020 |
| JP | H06120139 | 4/1994 |
| JP | 2018535545 A | 11/2018 |
| JP | 6452016 B1 | 1/2019 |
| JP | 6466620 B1 | 2/2019 |
| KR | 20070078176 A | 7/2007 |
| KR | 20120054636 A | 5/2012 |
| KR | 20160028794 A | 3/2016 |
| KR | 20200065096 A | 6/2020 |
| TW | 202013555 A | 4/2020 |
| WO | 2011021549 A1 | 2/2011 |
| WO | 2017062852 A1 | 4/2017 |
| WO | 2019089185 A1 | 5/2019 |
| WO | 2019/236252 A1 | 12/2019 |
| WO | 2020048981 A2 | 3/2020 |

OTHER PUBLICATIONS

Office Action for Taiwan Application No. 110124931 dated Aug. 2, 2022.
Search Report for Taiwan Application No. 110124931 dated Jul. 29, 2022.
Office Action for Japanese Application No. 2022-543659 dated Nov. 28, 2023.
Office Action for Chinese Application No. 202180011984.1 dated Feb. 27, 2024.
Search Report for Chinese Application No. 202180011984.1 dated Feb. 26, 2024.
Extended European Search Report for European Application No. 21837651.5 dated May 7, 2024.
Office Action for Chinese Application No. 202180011984.1 dated Sep. 27, 24.
Search Report for Chinese Application No. 202180011984.1 dated Sep. 25, 24.
Office Action for Korean Application No. 10-2022-7025466 dated May 20, 2024.
Search Report and Written Opinion for Singapore Application No. 11202250978T dated Dec. 30, 2024.

* cited by examiner

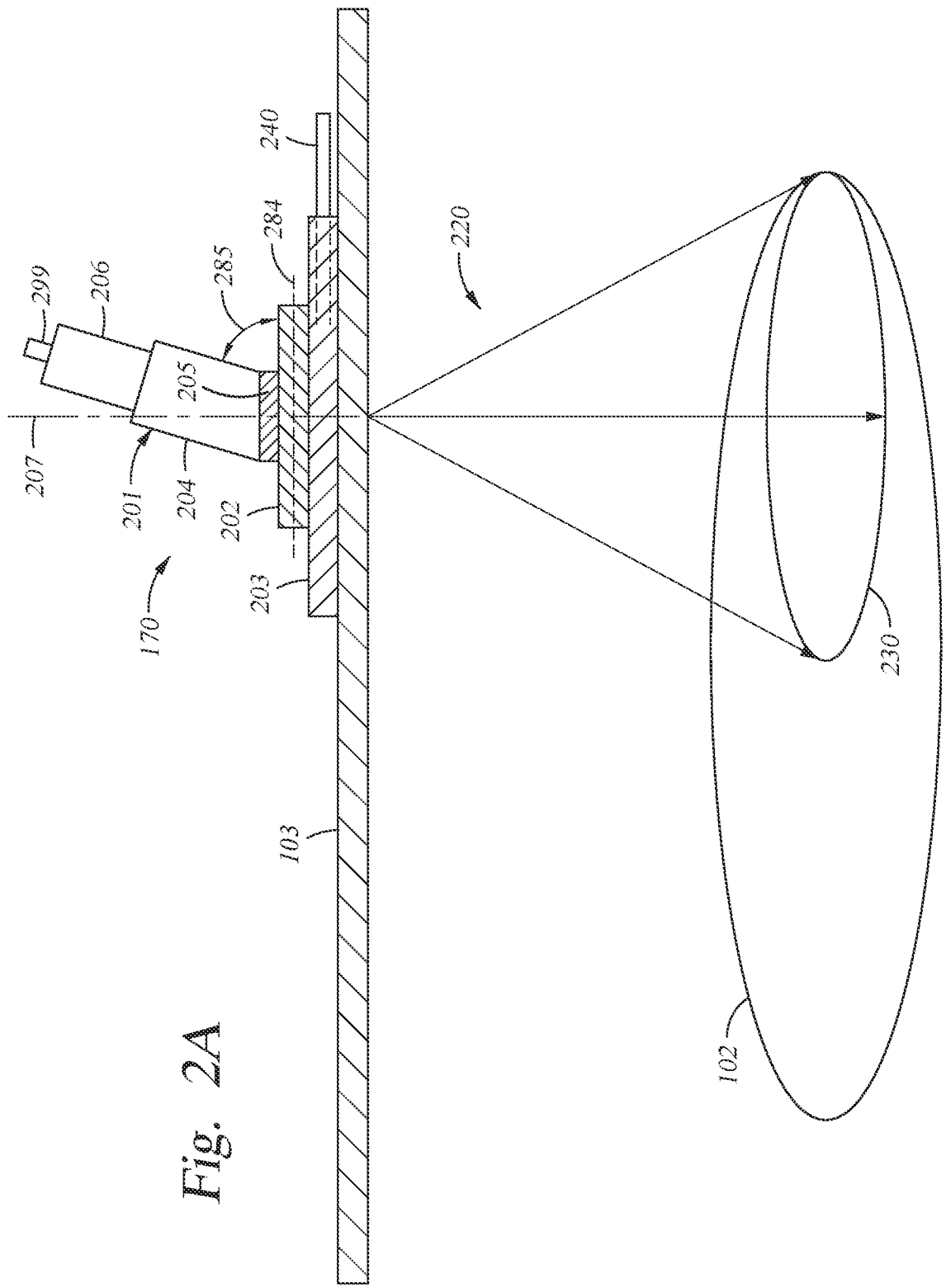

SPOT HEATING BY MOVING A BEAM WITH HORIZONTAL ROTARY MOTION

CROSS-REFERENCE TO RELATED APPLICATIONS

This application is a continuation application of U.S. patent application Ser. No. 16/923,949, filed Jul. 8, 2020, which is herein incorporated by reference.

BACKGROUND

Field

Embodiments of the present disclosure generally relate to apparatus and methods for semiconductor processing, more particularly, to a thermal process chamber and spot heaters used therein.

Description of the Related Art

Semiconductor substrates are processed for a wide variety of applications, including the fabrication of integrated devices and microdevices. During processing, the substrate is positioned on a substrate support within a process chamber. The substrate support is supported by a support shaft, which is rotatable about a central axis. Precise control over a heating source allows the substrate to be heated within very strict tolerances. The temperature of the substrate can affect the uniformity of the material deposited on the substrate.

Despite the precise control of heating the substrate, it has been observed that valleys (lower deposition) are formed at certain locations on the substrate. Therefore, there is a need for apparatus for improving heating uniformity.

SUMMARY

Embodiments of the present disclosure generally relate to apparatus and methods for semiconductor processing, more particularly, to a spot heating source, a thermal process chamber including the same, and a method of using the same. In one or more embodiments, a process chamber comprises a first window, a second window, a substrate support disposed between the first window and the second window, and a motorized rotatable radiant spot heating source disposed over the first window and configured to provide radiant energy through the first window.

In one or more embodiments, a spot heating source assembly comprises a collimator holder and a rotary stage disposed in a first plane, wherein the collimator holder is mounted to the rotary stage at an acute angle with respect to the first plane.

In one of more embodiments, a method for spot heating comprises disposing a substrate on a substrate support in a process chamber, activating a spot heating source mounted on a rotary stage to project radiant energy to the substrate, moving the spot heating source along an arcuate path to adjust the impact point of the projected radiant energy on the substrate, and heating a desired area of the substrate with the projected radiant energy.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2A is a schematic perspective side view of a spot heating source assembly radiation path according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods for semiconductor processing, more particularly, to a thermal process chamber and spot heat heating assemblies used therewith. The thermal process chamber includes a substrate support, a first plurality of heating elements disposed over the substrate support, and one or more spot heating source assemblies disposed over the first plurality of heating elements. The one or more spot heating source assemblies are utilized to provide local heating to regions of lower temperature on a substrate disposed on the substrate support during processing. Localized heating of the substrate improves temperature profile, which in turn improves deposition uniformity.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The substrate itself is not limited to any particular size or shape. Although the embodiments described herein are generally made with reference to a round 200 mm, 300 mm, or 450 mm substrate, other shapes, such as polygonal, squared, rectangular, curved, or otherwise non-circular workpieces may be utilized according to the embodiments described herein.

Figure 1A:
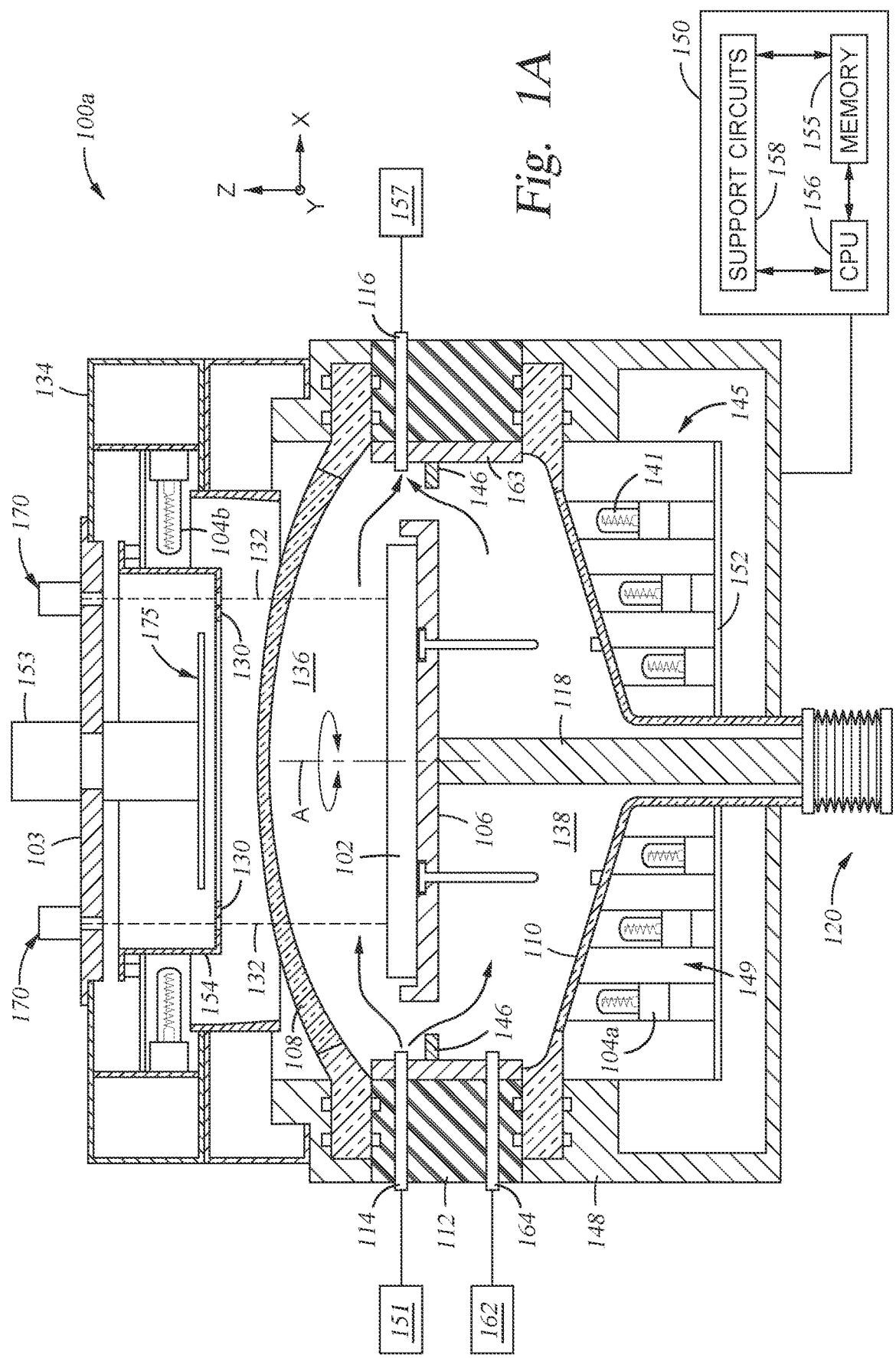
FIG. 1A is a schematic cross sectional side view of a process chamber according to one or more embodiments.

FIG. 1A is a schematic cross sectional side view of a process chamber 100a according to one embodiment. The process chamber 100a is a process chamber for performing a thermal process, such as an epitaxial deposition process. The process chamber 100a includes a chamber lid 103, a chamber body 148, a cover 134, and arrays of radiant heating lamps 104a, 104b for heating, and, a susceptor 106 disposed within the process chamber 100a. The arrays of radiant heating lamps 104a, 104b are disposed below and above the susceptor 106, although one of the upper array of radiant heating lamps 104a or lower array of radiant heating lamps 104b may be omitted. The arrays of radiant heating lamps 104a, 104b provide a total lamp power of between about 10 KW and about 60 KW. The arrays of radiant heating lamps 104a, 104b heat the substrate 102 to a temperature of between about 500 degrees Celsius and about 900 degrees Celsius; however, other temperature ranges are contemplated.

The arrays of radiant heating lamps 104a, 104b are independently controlled in zones in order to control the temperature of various regions of the substrate 102 as the process gas passes thereover, thus facilitating the deposition of a material onto the upper surface of the substrate 102. While not discussed here in detail, the deposited material may include silicon, doped silicon, germanium, doped germanium, silicon germanium, doped silicon germanium, gallium arsenide, gallium nitride, or aluminum gallium nitride, among other materials.

The arrays of radiant heating lamps 104a, 104b include a radiant heat source, depicted here as a lamp bulb 141. Each lamp bulb 141 is coupled to a power distribution board 152, such as a printed circuit board (PCB), through which power is supplied to each lamp bulb 141. The arrays of radiant heating lamps 104a, 104b located beneath the second window 110 are positioned within a lamphead 145, which may be cooled during or after processing by, for example, a cooling fluid introduced into channels 149 located between the arrays of radiant heating lamps 104a, 104b.

The susceptor 106 is a disk-like substrate support as shown, but may alternatively include a ring-like substrate support, which supports the substrate 102 from the edge of the substrate 102, exposing a backside of the substrate 102 to heat from the radiant heating lamps 104. The susceptor 106 is formed from silicon carbide or graphite coated with silicon carbide to absorb radiant energy from the radiant heating lamps 104 and conduct the radiant energy to the substrate 102, to facilitate heating the substrate 102.

The susceptor 106 is located within the process chamber 100a between a first window 108, and a second window 110. Each of the first window 108 and the second window 110 are shaped as domes. However, it is contemplated that the first window 108 and the second window 110 may have other shapes, including planar. A base ring 112 is disposed between the first window 108 and second window 110. Each of the first window 108 and the second window 110 is optically transparent to radiant energy provided by the arrays of radiant heating lamps 104a, 104b. The first window 108 is disposed between the chamber lid 103 and the susceptor 106. The upper array of radiant heating lamps 104a is disposed above the first window 108. A reflector 154 facilitates directing of thermal energy from the upper array of radiant heating lamps 104a. Similarly, the lower array of radiant heat lamps is disposed below the second window 110.

The susceptor 106 includes a shaft or stem 118 that is coupled to a motion assembly 120. The motion assembly 120 includes one or more actuators and/or adjustment devices that provide movement and/or adjustment and/or rotation of the stem 118 and/or the susceptor 106. The susceptor 106 may rotate at between about 5 RPM and about 100 RPM, for example, between about 10 RPM and about 50 RPM. The susceptor 106, while located in the processing position, divides the process chamber 100a into a process gas region 136 that is above the susceptor 106, and a purge gas region 138 below the susceptor 106. A process gas inlet 114, a purge gas inlet 164, and a gas outlet 116 are provided in the base ring 112 to facilitate exposure of the substrate 102 to process gas during processing. A process gas source 151 provides a process gas to the process gas inlet 114, and a purge gas source 162 provides a purge gas to the purge gas inlet 164. The process and purge gases flow through the gas outlet 116 to an exhaust assembly 157.

A circular shield 146 is disposed around the susceptor 106 and coupled to the base ring 112 and/or a liner 163 to prevents or minimizes leakage of heat from the radiant heating lamps 104. Additionally, a heat shield 175 is disposed above the reflector 154 to block unwanted transmission of heat. The heat shield 175 is fabricated from a metal material, for example aluminum, and coated with gold. Substrate temperature may be indirectly measured by sensors configured to measure temperatures at the bottom of the susceptor 106. The sensors may be pyrometers disposed in ports formed in the lamphead 145. Additionally, one or more temperature sensors 153, such as a pyrometer, are directed to measure the temperature of the device side of the substrate 102. The one or more temperature sensors 153 are disposed through the chamber lid 103, and configured to detect the substrate 102 through an opening formed through the heat shield 175.

The process chamber 100a further includes one or more spot heating source assemblies 170 (two are shown). Each spot heating source assembly 170 is, for example, a laser system assembly. Power density of the laser system assembly may range from about 1 W/cm$^2$ to about 1000 W/cm$^2$, for example about 1 W/cm$^2$ to about 200 W/cm$^2$, for example about 200 W/cm$^2$ to about 1000 W/cm$^2$. Each spot heating source assembly 170 is coupled to and disposed on an upper surface of the chamber lid 103. Each spot heating source assembly 170 directs radiant energy 132 through an opening 130 (which may have an optically transparent window therein) of the reflector 154, through the first window 108, and toward the susceptor 106. Radiant energy 132 from each spot heating source assembly 170 is directed towards the susceptor 106 in order to impinge upon one or more predetermined locations of the substrate 102 positioned on the susceptor 106. The radiant energy 132 from the spot heating source assembly 170 selectively heats predetermined locations of the substrate, resulting in more uniform substrate temperature (and thus more uniform deposition) during processing. The thermal energy provided by each spot heating source assembly 170 is directed to a location on the substrate 102 in response to temperature measurements by the temperature sensor 153 and one or more instructions from a controller 150.

Although two spot heating source assemblies 170 are shown in the process chamber 100a, it is contemplated that one or more spot heating source assemblies 170 may be mounted on the process chamber 100a, for example two spot heating source assemblies 170, for example three spot heating source assemblies 170, for example four spot heating source assemblies 170. Multiple spot heating source assemblies 170 may be mounted due to the advantageous decreased bulk of the mounting system of each spot heating source assembly 170, particularly compared to track-mounted spot heating source assemblies.

The above-described process chamber 100a is controlled by a processor based system controller, such as controller 150. For example, the controller 150 is configured to control pressure, temperatures, and flow rates within the process chamber 100a. By way of further example, the controller 150 is configured to operate the spot heating source assembly 170 to facilitate improved temperature uniformity of a substrate 102. The controller 150 includes a programmable central processing unit (CPU) 156 that is operable with a memory 155, support circuits 158, and a mass storage device, an input control unit, and a display unit (not shown), such as power supplies, clocks, cache, input/output (I/O) circuits, and the like, coupled to the various components of the process chamber 100a to facilitate control of the substrate processing. The controller 150 also includes hardware for monitoring substrate processing through sensors in the process chamber 100a, including sensors monitoring the precursor, process gas and purge gas flow. Other sensors that measure system parameters such as substrate temperature, chamber atmosphere pressure and the like, may also provide information to the controller 150.

Figure 1B:
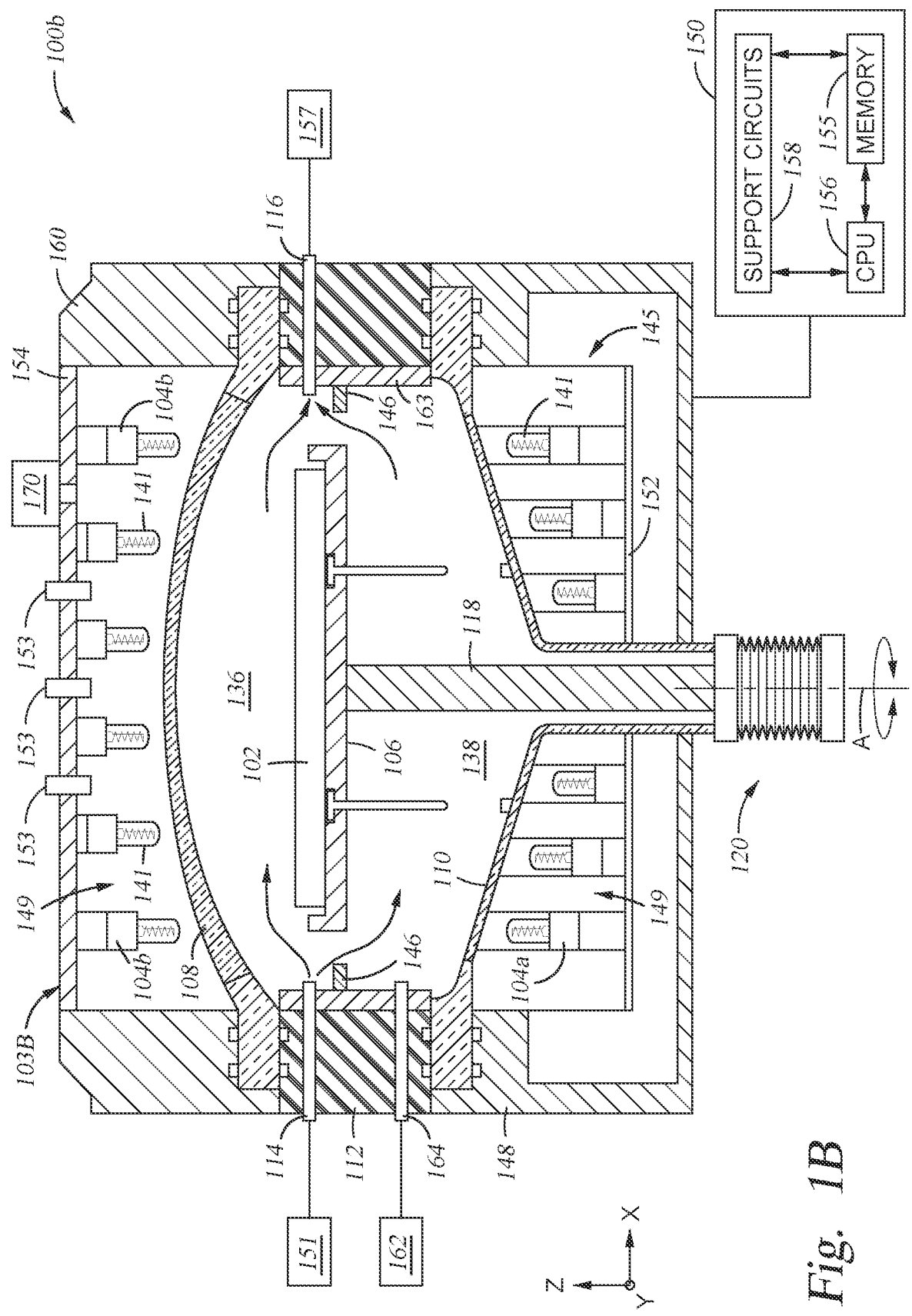
FIG. 1B is a schematic cross sectional side view of a process chamber according to another embodiment.

FIG. 1B illustrates a cross sectional view of a process chamber 100b according to one or more embodiments. The process chamber 100b is similar to the process chamber 100a shown in FIG. 1A, but utilizes a different lid 103B. The lid 103B is coupled to a clamp ring 160. A plurality of radiant heat lamps 104b are mounted to the lid 103B proximate the reflector 154. One or more temperature sensors 153 are coupled to the lid 103B and positioned to facilitate temperature measurement of the substrate 102. One or more spot heating source assemblies 170 (one is shown) are also disposed on an upper surface of the chamber lid 103B and positioned to direct radiant energy to the substrate 102.

FIG. 2A illustrates a perspective view of the spot heating source assembly 170. The spot heating source assembly 170 includes a radiant spot heating source 201, a rotary stage 202, a rotary plate 205, and a cooling plate 203. The radiant spot heating source 201 is disposed on and above the rotary plate 205, which in turn is disposed on and above the rotary stage 202, which in turn is disposed on and above the cooling plate 203. The rotary stage 202 is disposed in a first plane 284. The rotary plate 205 is disposed parallel to the first plane 284 and is rotatable within or on the rotary stage 202 to rotate the radiant spot heating source 201. Bearings, such as ball bearings and/or sealed bearings configured to withstand vacuum (e.g., vacuum-tight) or elevated pressures without leaking, may be positioned between the rotary stage 202 and the rotary plate 205 to facilitate movement therebetween. In one or more embodiments, the radiant spot heating source 201 is mounted at an acute angle 285 with respect to the first plane 284. The acute angle 285 may be within a range of about 75 degrees to about 85 degrees. However, other ranges are also contemplated, for example about 60 degrees to about 90 degrees. The radiant spot heating source 201 transmits energy 220 through the rotary plate 205, the rotary stage 202, and the cooling plate 203 at the acute angle 285. Openings formed through the rotary plate 205, the rotary stage 202, and the cooling plate 203, which accommodate radiant energy, may have sidewalls formed at an angle which matches the acute angle 285. The radiant spot heating source 201 is motorized (e.g., driven by a motor or other mechanical actuator), rotatable, and configured to provide radiant energy through the first window 108.

The acute angle 285 at which the radiant spot heating source 201 is mounted allows the radiant spot heating source 201 to provide energy 220 to the substrate 102 at an acute angle with respect to a plane of the 102, which is generally perpendicular to the first plane 284. Rotating the rotary plate 205 to rotate the radiant spot heating source 201 enables the energy 220 provided by the radiant spot heating source 201 to heat the substrate 102 in a circular or semi-circular (e.g., arc-shaped or arcuate) pattern 230 on the substrate 102. While a complete circular pattern 230 is shown in FIG. 2A, a semicircular pattern is contemplated.

Figure 2B:
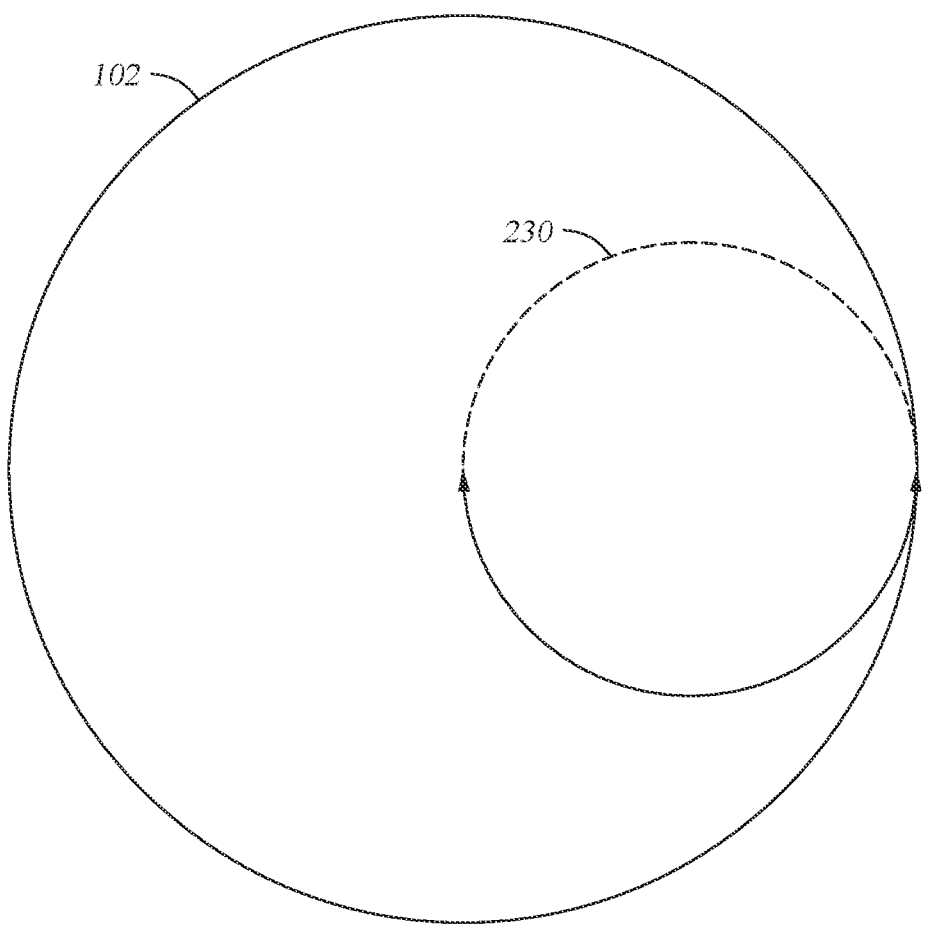
FIG. 2B is a schematic top-down view of the spot heating source assembly of FIG. 2A according to one or more embodiments.

FIG. 2B illustrates a semicircular pattern 230 formed on the substrate 102. In one example, the pattern 230 may be between 60 and 180 degrees of arc, such as between about 60 and 120 degrees of arc. In FIG. 2B, a 180 degree path is shown solid line. However, it is contemplated that up to 360 degrees of rotation or possible, if desired. In one embodiment, one or more rotation stops are disposed on the rotary stage 202, allowing the rotary plate 205 to rotate a set amount on the rotary stage 202 as defined by the one or more rotation stops. The one or more rotation stops restrict the rotation of the rotary plate 205 to create the desired pattern 230. In one example, the stops may be two posts that extend vertically from an upper surface of the rotary stage 202. An extension, which extends in a cantilevered manner from the rotary plate 205, is positioned between the posts and travels therebetween as the rotary plate 205 rotates. The extension of the rotary plate 205 contacts the posts as the rotary plate rotates, thereby limiting the rotation of the rotary plate. It is contemplated that the posts may be positioned at predetermined positions to allow a predetermined degree of rotation of the rotary plate The radiant spot heating source 201 is configured to heat any point from the center to the outer edge of the substrate 102. The pattern 230 may extend for example from the center of the substrate 102 to the outer circumference of the substrate 102. Due to the angled mounting of the radiant spot heating source 201, the position of the location of the energy 220 with respect to distance from the center of the substrate 102 may be determined by a pre-programmed algorithm. In some examples, the position of the radiant spot heating source 201 remains fixed during processing. In other examples, the spot heating source is moved during processing while applying radiant energy. In such an example, the impingement location of the radiant energy may be swept back and forth across substrate surface as the substrate is rotated.

The rotary stage 202 is disposed on a cooling plate 203, which is disposed on the chamber lid 103. In one or more embodiments, the cooling plate 203 comprises aluminum. In one or more embodiments, the rotary stage 202 is disposed in direct contact with the cooling plate 203, to facilitate thermal transfer therebetween. The rotary stage 202 and the cooling plate 203 may be formed from materials with relatively high thermal conductivity, such as metals, for example, aluminum or aluminum alloys. The cooling plate 203 comprises channels 240 that flow a cooling fluid, for example water, through the cooling plate 203 in order to facilitate temperature control of the spot heating source assembly 170. In one or more embodiments, the channels 240 comprise one or more aluminum, stainless steel, and/or copper pipes.

The rotary stage 202 is configured to rotate about a vertical axis 207. In one or more embodiments, the rotary stage 202 is coupled to an actuator, such as a motor, configured to rotate the rotary plate 205 about the rotary stage 202. The motor may be any suitable motor, for example an optical grade motor optimized for accuracy, such as stepper motor. The rotary stage 202 may include a plurality of bearings to facilitate rotation of the rotary plate 205 about the vertical axis 207.

In one or more embodiments, the radiant spot heating source 201 includes a collimator holder 204. The collimator holder 204 is mounted to the rotary stage 202 at an acute angle with respect to the first plane 284. The radiant spot heating source 201 also includes a collimator 206 disposed within the collimator holder 204, operable to provide radiant spot heating to a region of the susceptor 106 and/or the substrate 102 positioned thereon. The collimator holder 204 facilitates support of the collimator 206. The collimator holder 204 may house one or more lenses therein. While the collimator 206 may receive optical energy from, or facilitate support of, an optical energy source such as a laser. As illustrated in FIG. 2A, an optical energy source 299, such as a laser, is engaged with collimator 206. In one example, each of the collimator holder 204 and the collimator 206 include housing formed from aluminum.

Power applied to the radiant spot heating source may vary depending on the use case. For example, power can be less than 100 W, for example from about 10 W to about 90 W, for example from about 20 W to about 80 W, for example from about 40 W to about 60 W. Power may vary during a single application depending on the location of the spot being heated with respect to the center of the substrate 102. In one or more embodiments, power may remain fixed during an application or process. Wavelength of the radiant source output may be any suitable value, for example between 900 nm to 1000 nm, for example about 970 nm.

Figure 2C:
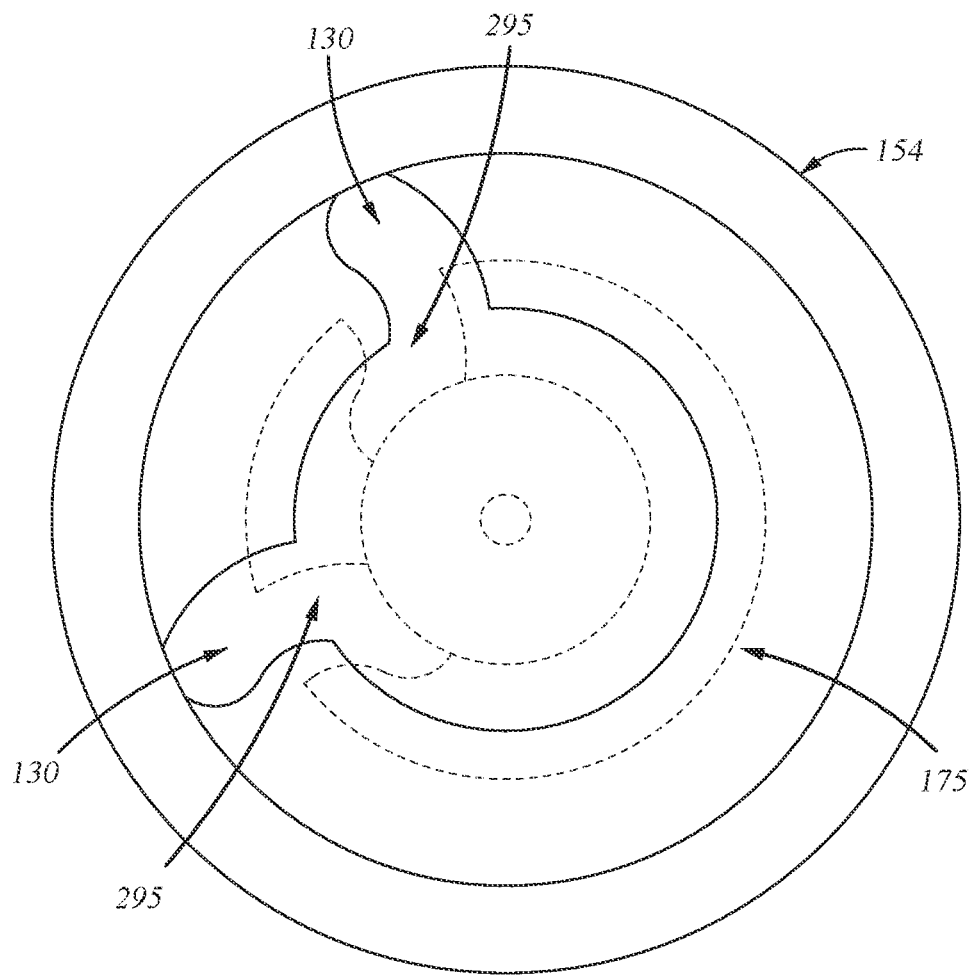
FIG. 2C is a schematic top-down view of a reflector according to one or more embodiments.

FIG. 2C is a schematic top-down view of the reflector 154 according to one or more embodiments. As discussed above, the reflector 154 includes one or more openings 130 through which the radiant energy 132 is directed to the susceptor 106. The openings 130 have a curved shape to accommodate the rotation of the spot heating source assemblies 170 as the spot heating source assemblies 170 are rotated. Additionally, the heat shield 175 (shown in phantom) is disposed above the reflector 154. The heat shield 175 additionally includes openings 295 formed therein. The openings 295 depicted herein are a curved oblong shape such that the radiant energy 132 (shown in FIG. 1A) from the spot heating source assemblies 170 may travel in the semicircular pattern 230, shown in FIG. 2B. The openings 130 and 295 are angularly offset (though may overlap) relative to one another. The angular offset between the openings 130 and 295 allows the radiant energy 132 to traverse the openings 130 and 295 when the radiant energy 132 is directed at angular relative to vertical due to the rotation of the spot heating source assembly 170 and vertical offset of the openings 130 and 295.

Figure 3A:
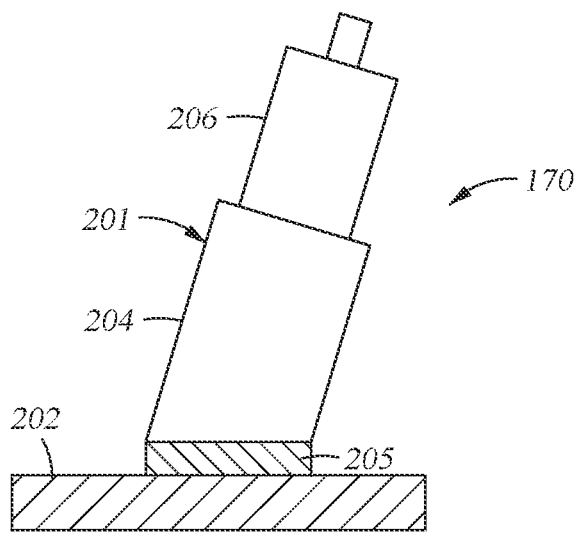
FIG. 3A is a schematic cross-sectional view of the spot heating source assembly of FIG. 2A according to one or more embodiments.
Figure 3B:
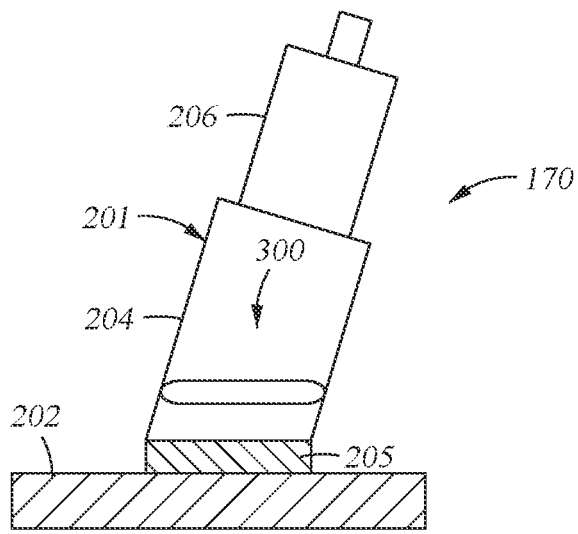
FIG. 3B is a schematic cross-sectional view of the spot heating source assembly of FIG. 2A according to one or more embodiments.
Figure 3C:
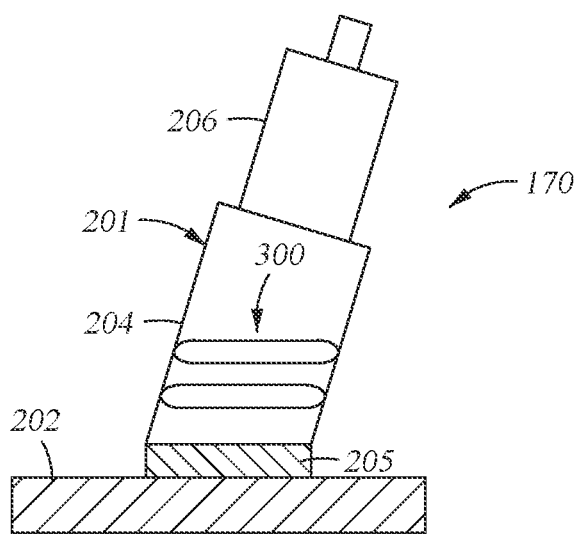
FIG. 3C is a schematic cross-sectional view of the spot heating assembly of FIG. 2A according to one or more embodiments.

FIG. 3A illustrates a schematic cross-sectional view of the spot heating source assembly 170 of FIG. 2A in which the collimator holder 204 is free of lenses mounted therein. The spot heating source assembly 170 includes a rotary stage 202, a rotary plate 205, a collimator holder 204, and a collimator 206. FIG. 3B illustrates a schematic cross-sectional view of the spot heating source assembly 170 of FIG. 2A in which the collimator holder includes one lens 300 mounted therein. FIG. 3C illustrates a schematic cross-sectional view of the spot heating source assembly 170 of FIG. 2A in which the collimator holder comprises a plurality of lenses 300 mounted therein. The one or more lenses 300 are formed from any suitable material, for example quartz, and may be coated in an anti-reflective coating. The one or more lenses 300 disposed within the collimator holder 204 allow for varied focal lengths that enable heat provided by the spot heating source assembly 170 to contact various spot sizes on the substrate 102. It is contemplated that the lenses 300 may include concave lenses, convex lenses, Fresnel lenses, or other lens designs.

Figure 4:
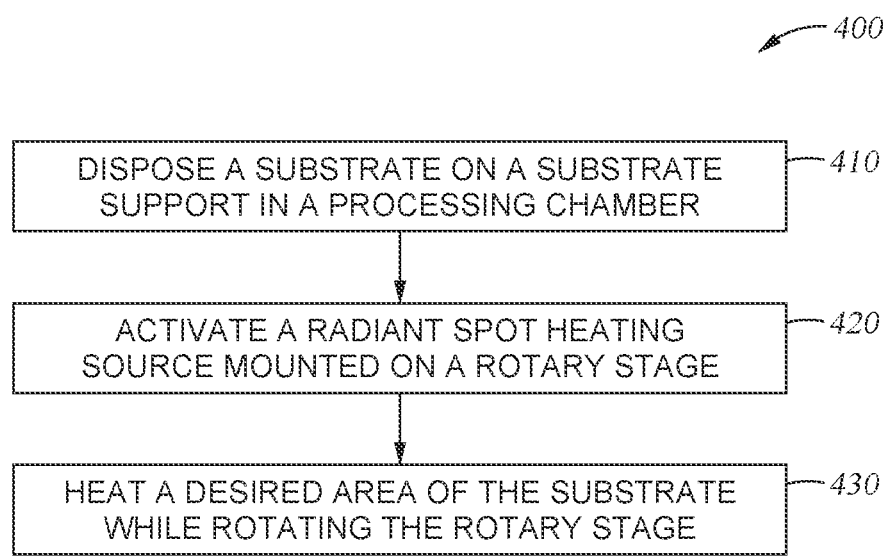
FIG. 4 is a flow diagram of a method according to one or more embodiments.

FIG. 4 schematically illustrates operations of a method 400 for processing a substrate. In some embodiments, the method 400 may locally heat the substrate in an epitaxial deposition chamber.

At operation 410, a substrate is disposed on a substrate support of a process chamber. In some embodiments, the process chamber may be an epitaxy deposition chamber, for example the process chamber 100a, 100b shown in FIG. 1A. However, other process chambers are contemplated.

At operation 420, a spot heating source mounted on a rotary stage is activated to project radiant energy to the substrate. The activation may include powering a laser source, such as a diode laser source. The activation may heat an area, portion, or specific region of the substrate 102. The activation may last for any length of time and may be, in certain embodiments a constant firing and/or a pulsed firing. In pulsed firing, the laser source may have a duty cycle less than 50%, for example 25%, for example 5%, for example 1%. The time between pulses in the pulsed firing may be between about 10 microseconds (μs) to about 10 milliseconds (ms), for example between about 0.5 ms to about 5 ms. The activation may heat a desired area, portion, or region of the substrate in order to reduce a cold spot thereon to provide a more uniform temperature across the substrate. It is further contemplated that other types of lasers or radiant energy sources may be utilized. In one embodiment, the spot heating source is moved along an arcuate path to adjust the impact point of the projected radiant energy on the substrate.

At operation 430, a desired area of the substrate is heated following activation of the radiant spot heating source mounted on a rotary stage. In one or more embodiments, the substrate support is rotated while heating the desired area of the substrate. In one or more embodiments, the rotary stage is rotated while heating the desired area of the substrate. In one or more embodiments, the substrate support and the rotary stage are rotated while heating the desired area of the substrate. It is also contemplated that the rotary stage may be rotated prior to activation of the radiant spot heater, to directed radiant energy a predetermined location.

It is contemplated that while process chambers for epitaxial deposition are shown and described herein, the subject matter of the present disclosure is also applicable to other process chambers that are capable of providing a controlled thermal cycle that heats the substrate for processes such as, for example, thermal annealing, thermal cleaning, thermal chemical vapor deposition, thermal oxidation and thermal nitridation, regardless of whether the heating elements are provided at the top, bottom, or both the top and bottom of the process chamber.

Benefits of the present disclosure include a reduction in temperature non-uniformities on a substrate, creating a substrate with a more uniform material deposition thereon. A cost reduction is also realized in that there is an increase in substrate quality, and thus, a reduction in scrap. Additional benefits include precise local heating of the substrate for ultra-fine tuning of temperature uniformity. Further benefits of the present disclosure include decreased bulk compared to conventional approaches. The decreased bulk improves overall lifetime of the assembly, as there is less wear on components of the system. Additionally, the disclosed spot heaters mitigate sealing issues present with linear and vertical slotted mounting mechanisms, thus facilitating maintenance of a high pressure environment. The maintained pressure further facilitates cooling of the lamp module, thereby extending the longevity and effectiveness of the process chamber and components thereof.

In summation, embodiments described herein provide an epitaxial deposition chamber that includes a spot heating source assembly for providing heating of a substrate during processing. Energy may be focused to locally heat and tune specific locations of the substrate. The spot heating source assembly comprises a collimator holder disposed on a rotary stage, operable to heat portions of a substrate without allowing light and air to escape the substrate processing region. This assembly prevents hazards related to unwanted light and air flow out of the substrate processing region, and provides a long-lasting assembly with minimized bulk and cost.

While the foregoing is directed to embodiments of the present disclosure, other and further embodiments of the disclosure may be devised without departing from the basic scope thereof, and the scope thereof is determined by the claims that follow.

What is claimed is:

1. A process chamber, comprising:
   a first window;
   a second window;
   a substrate support disposed between the first window and the second window,
the substrate support configured to support a substrate;
   a rotary stage disposed in a first plane above the first window; and
   a rotatable radiant spot heating source disposed over the first window and configured to provide radiant energy through the first window, such that the rotatable radiant spot heating source is mounted to the rotary stage and positioned at an acute angle with respect to the first plane, wherein the rotary stage is rotatable to rotate the rotatable radiant spot heating source about a rotational axis orthogonal to the first plane, the rotatable radiant spot heating source configured to direct the radiant energy toward the substrate supported on the substrate support in a sweeping motion at least partially along an arcuate path, the arcuate path extending from a center of the substrate to a circumference of the substrate.

2. The process chamber of claim 1, wherein the rotational axis passes through the rotary stage and the rotary stage is coupled with an actuator configured to rotate the rotatable radiant spot heating source about the rotary stage.

3. The process chamber of claim 2, wherein the rotational axis also passes through the rotatable radiant spot heating source.

4. The process chamber of claim 3, wherein the rotational axis is non-parallel with a longitudinal axis of the rotatable radiant spot heating source.

5. The process chamber of claim 4, wherein a cooling plate is disposed in a second plane parallel to the first plane.

6. The process chamber of claim 5, wherein the rotary stage is disposed in direct contact with the cooling plate.

7. The process chamber of claim 3, wherein the rotatable radiant spot heating source is configured to direct radiant energy in a ring-shaped pattern across a surface of a substrate disposed of the substrate support.

8. The process chamber of claim 7, wherein a distance from the rotatable radiant spot heating source to the ring-shaped pattern on the surface of the substrate is equidistant at all points along the ring-shaped pattern.

9. The process chamber of claim 2, wherein the rotatable radiant spot heating source comprises:
   a collimator holder; and
   a collimator disposed in the collimator holder.

10. A process chamber, comprising:
    a first window;
    a substrate support disposed proximate the first window, the substrate support configured to support a substrate;
    a rotary stage disposed in a first plane; and
    a rotatable radiant spot heating source mounted to the rotary stage and configured to provide radiant energy through the first window toward the substrate support, the rotatable radiant spot heating source positioned at an acute angle with respect to the first plane, wherein the rotary stage is rotatable to rotate the rotatable radiant spot heating source about a rotational axis orthogonal to the first plane,
    the rotatable radiant spot heating source configured to direct the radiant energy to the substrate supported on the substrate support in a sweeping motion at least partially along an arcuate path, the arcuate path extending from a center of the substrate to a circumference of the substrate.

11. The process chamber of claim 10, wherein the rotational axis passes through the rotary stage and the rotary stage is coupled with an actuator configured to rotate the rotatable radiant spot heating source about the rotary stage.

12. The process chamber of claim 11, further comprising:
    a collimator disposed on a collimator holder; and
    a laser coupled to the collimator.

13. The process chamber of claim 12, wherein the collimator holder comprises at least one lens mounted therein.

14. The process chamber of claim 13, wherein the rotational axis is non-parallel with a longitudinal axis of the rotatable radiant spot heating source.

15. The process chamber of claim 14, wherein the rotatable radiant spot heating source is configured to direct radiant energy in a ring-shaped pattern across a surface of a substrate disposed of the substrate support.

16. The process chamber of claim 15, wherein a distance from the rotatable radiant spot heating source to the ring-shaped pattern on the surface of the substrate is equidistant at all points along the ring-shaped pattern.

* * * * *